United States Patent
Riedl et al.

(10) Patent No.: US 6,944,832 B2
(45) Date of Patent: Sep. 13, 2005

(54) SYSTEM DESIGN USING PART ROLES

(75) Inventors: Patrick H. Riedl, Seattle, WA (US); Jerome S. Mothershead, Covington, WA (US)

(73) Assignee: The Boeing Company, Chicago, IL (US)

( * ) Notice: Subject to any disclaimer, the term of this patent is extended or adjusted under 35 U.S.C. 154(b) by 308 days.

(21) Appl. No.: 10/175,973

(22) Filed: Jun. 20, 2002

(65) Prior Publication Data

US 2003/0237057 A1 Dec. 25, 2003

(51) Int. Cl.⁷ .............................................. G06F 17/50
(52) U.S. Cl. ......................................... 716/1; 707/100
(58) Field of Search ...................... 716/1; 707/1, 100; 706/45–46; 701/1, 100

(56) References Cited

U.S. PATENT DOCUMENTS

| | | | |
|---|---|---|---|
| 4,873,623 A * | 10/1989 | Lane et al. ................... 700/83 |
| 4,918,614 A | 4/1990 | Modarres et al. |
| 5,109,337 A | 4/1992 | Ferriter et al. |
| 5,307,261 A | 4/1994 | Maki et al. |
| 5,311,424 A | 5/1994 | Mukherjee et al. |
| 5,357,440 A | 10/1994 | Talbott et al. |
| 5,359,523 A | 10/1994 | Talbott et al. |
| 6,018,716 A | 1/2000 | Denardo et al. |
| 6,036,345 A | 3/2000 | Jannette et al. |
| 6,138,104 A | 10/2000 | Marchak et al. |
| 6,161,052 A | 12/2000 | Charlton et al. |
| 6,177,942 B1 | 1/2001 | Keong et al. |
| 6,237,007 B1 | 5/2001 | Brown |
| 6,243,614 B1 | 6/2001 | Anderson |
| 6,268,853 B1 * | 7/2001 | Hoskins et al. ............... 700/83 |
| 6,484,182 B1 * | 11/2002 | Dunphy et al. ................ 707/3 |
| 6,513,129 B1 * | 1/2003 | Tentij et al. .................... 714/4 |
| 6,535,884 B1 * | 3/2003 | Thornton et al. ........... 707/100 |
| 2003/0023606 A1 * | 1/2003 | Lee et al. ..................... 707/100 |
| 2003/0200220 A1 * | 10/2003 | Hu et al. ..................... 707/100 |
| 2003/0229639 A1 * | 12/2003 | Carlson et al. ............. 707/100 |
| 2003/0229640 A1 * | 12/2003 | Carlson et al. ............. 707/100 |
| 2004/0139087 A1 * | 7/2004 | Bittner et al. .............. 707/100 |
| 2005/0015381 A1 * | 1/2005 | Clifford et al. ............. 707/100 |
| 2005/0038804 A1 * | 2/2005 | Shimizu ..................... 707/100 |

FOREIGN PATENT DOCUMENTS

EP          855655 A2       7/1998

* cited by examiner

Primary Examiner—Stacy A. Whitmore
(74) Attorney, Agent, or Firm—Thomas F. Lebens; Fitch, Even, Tabin & Flannery

(57) ABSTRACT

A method of structure knowledge to achieve a single source of product definition that is readily applicable to large-scale system design and manufacture. Part roles are defined to represent common design elements as shared by distinct product views. These part roles are defined at a logical, more abstract level, with other mechanisms (including configuration variables of various kinds) serving to provide additional details that specify a particular final design. Design packages use these components to specify, in a single source, the definition of a product (requirements and design solutions) that will support various views for various needs and purposes.

22 Claims, 5 Drawing Sheets

SYSTEM DESIGN USING PART ROLES

TECHNICAL FIELD

This invention relates generally to knowledge management and more particularly to large-scale system integration design.

BACKGROUND

Realizing a large-scale system (such as an airplane, space shuttle, submarine, helicopter, power plant, aircraft carrier, or the like) constitutes a complex undertaking. Without exception, such large-scale systems are comprised of a working conglomeration of smaller-scale systems, which themselves are comprised of even smaller-scale systems, and so forth. Notwithstanding the necessity of building, retaining, and imparting an overall vision of a large-scale system, it is nevertheless imperative that such a system be defined in detail to the level of the individual constituent components that together bring the system to physical being.

The overall design of a large-scale system is usually represented and realized by thousands of design artifacts (including virtual and hardcopy documents such as schematic diagrams, data tables, instructional text, exploded graphic views, and so forth). Together these design artifacts represent the knowledge the enterprise has regarding the design and manufacture of the large-scale system itself Also typically, however, considerable overlap often exists between these design artifacts; that is, the contents of each artifact are usually not mutually exclusive to the contents of all other artifacts. For example, a given component or role such as a circuit breaker may appear in multiple artifacts (some dealing with the electric connections, some dealing with the part number and source, some dealing with the physical mounting of the object, and so forth). The more integrated the large-scale system, the more likely an overlap exists between its artifacts. The existence of such multiple views can and will often lead to contradictions between the artifacts. For example, a parts listing artifact may identify a given circuit breaker as being a particular device from a particular supplier while a diagram artifact identifying the location of mounting holes for the circuit breaker may reflect a different part altogether. Ultimately, agreement must be achieved between such artifacts. Unfortunately, at best, the cost of resolving discovered contradictions is surprisingly high (for example, $25,000 in total overall costs and expenses can easily be consumed to resolve a single contradiction in a large-scale system such as a commercial airliner). And, at worst, the contradiction goes undiscovered until a corresponding problem brings the circumstance to light.

The above problem results at least in part due to scattering of the essential knowledge represented in these various design artifacts through the enterprise (in multiple information systems) and across the large-scale design activities. So-called single source design constructs have been theoretically proposed in the prior art as a conceptual way to avoid at least some of these issues. Pursuant to such a notion, all knowledge regarding a given product is contained in a single product definition regardless of how many views may be available to access such knowledge. Unfortunately, such constructs have remained more theoretical than real; one key obstacle has been identifying a way to represent the knowledge of the enterprise in the single source system. As one facet of the problem, different views (including combinations and/or formatting elections) of the knowledge are required to suit various participants and activities during the design and subsequent manufacture of the large-scale system. As another side of the problem, thousands of variations are possible with virtually any given design. No one has presented an effective way to accommodate such multiple configurations within a single source context.

Therefore, notwithstanding a long-understood problem that contributes greatly and frequently to design and manufacture delay, quality issues, and costly expenditures, industry continues more or less to use traditional knowledge management tools and their corresponding views and product artifacts to bring large-scale systems from concept to reality.

BRIEF DESCRIPTION OF THE DRAWINGS

The above needs are at least partially met through provision of the system design using part roles as described in the following detailed description, particularly when studied in conjunction with the drawings, wherein.

Figure 1:
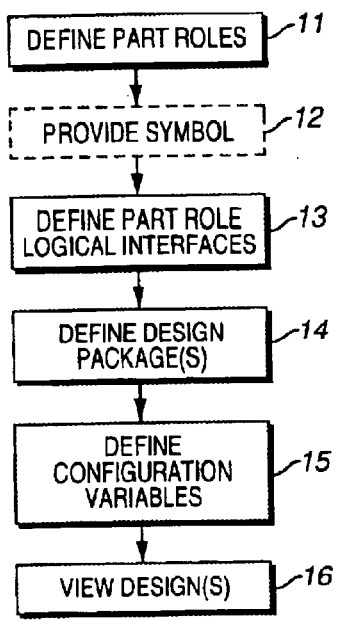
FIG. 1 comprises an overview flow diagram as configured in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are typically not depicted in order to facilitate a less obstructed view of these various embodiments of the present invention. Those skilled in the art will also recognize that much of the information is presented using the Unified Modeling Language. The Unified Modeling Language is a known prior art language standard (as developed and specified by the Object Management Group) for specifying, visualizing, constructing, and documenting the artifacts of systems (including software systems, business models, and hardware systems).

DETAILED DESCRIPTION

Generally speaking, pursuant to these various embodiments, a plurality of part roles are defined, wherein the part roles represent a plurality of common design elements as shared by a family of distinct product views. Each part role includes a part role name, a role description, a type indicator, and a reference designator. The part role name constitutes, at least partially, a generic description of the corresponding design elements that are common within the family of distinct product views. The role description comprises a short textual definition of the part role. The type indicator is a second generic description of the corresponding design elements, which second generic description tends to be broader than the generic description of the part role name. The reference designator comprises an identifier, such as a unique alphanumeric string, to enable discrete identification and tracking of the corresponding part role.

In one embodiment, these part roles are defined at a relatively high logical level, such that a given part role will not itself specify performance requirements, installation requirements, or location requirements. Such quantifications are critical, of course, to a final design. Information such as this is provided in other ways pursuant to these embodiments, however. By defining part roles to the exclusion of such criteria, however, the part roles become relevant and useful when articulating designs for many differing resultant product designs and/or distinct product views.

These part roles are usable to structure the knowledge of an enterprise and to thereby facilitate the design of large-scale systems, wherein the design is comprised of a large number of distinct product views. The distinct product views are themselves comprised of numerous design elements, and the part roles serve to bring a studied measure of flexible consistency to the identification and use of such design elements pursuant to a given design and/or design package(s). Via these embodiments, a single source of product definition is substantially achieved, thereby avoiding or at least minimizing the opportunity for inconsistencies between distinct product views that share common elements, either at the logical or at the physical level.

In one embodiment, at least some of the part roles can have a graphic symbol that uniquely corresponds thereto to facilitate use of the part roles for some purposes.

Pursuant to varying embodiments, these part roles are used and/or linked in conjunction with other objects including (but not limited to) other part roles, part role logical interfaces, and configuration variables.

Figure 2:
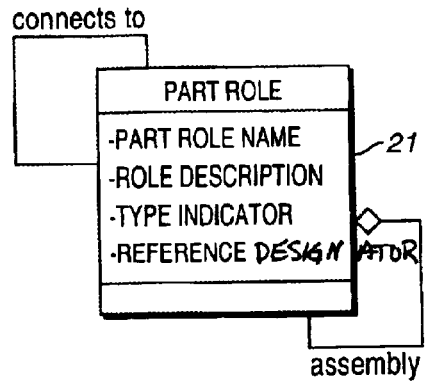
FIG. 2 comprises a general view of a part role as configured in accordance with an embodiment of the invention.
Figure 3:
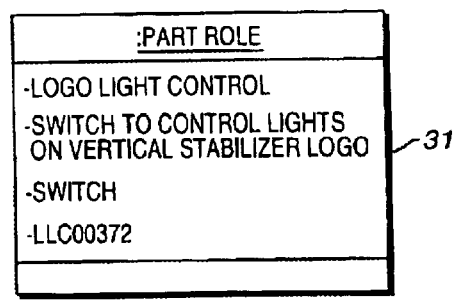
FIG. 3 comprises a specific example of an illustrative part role as configured in accordance with an embodiment of the invention.

Referring now to FIG. 1, various embodiments begin with defining 11 a plurality of part roles. Each part role typically represents a group of common design elements that are shared by a family of distinct product views, with each part role more specifically defining the behavior or function of an anticipated part, assembly of parts, or a part subset in the context of a product. As shown in FIG. 2, each part role 21 has a corresponding part role name, role description, type indicator, and reference designator. The part role name is a text string that constitutes a first generic description of the corresponding design elements that are common to the family of distinct product views (for example, and referring momentarily to a specific exemplary part role 31 as depicted in FIG. 3, a part role name for a category of switch that is used to control illumination of a logo on the tailfin of a commercial airline could be "Logo Light Control;" various specific switches could be and likely are used to serve this function hence casting this moniker as being generic to these group of design elements). The role description comprises a short textual definition, such as a sentence, that defines the role of the part in the context of a product (for example, as depicted in FIG. 3, a role description for a Logo Light Control could be, "Switch to control lights on vertical stabilizer logo").

The type indicator constitutes an attribute that defines the class of part or assembly of parts required to realize the part role 21 (a sample type indicator as depicted in FIG. 3 is "switch"), which therefore tends to result in a more generic descriptor than is represented by the part role name. In practice, there may be multiple "type" fields to classify the part role from different perspectives, but a single type only is shown here for clarity.

And lastly, the reference designator is an alphanumeric indicator that uniquely identifies the part role in the context of a given program or platform (for example, as depicted in FIG. 3, a reference designator could be "LLC00372"). It may be desirable to observe whatever relevant internal and/or external naming standards and conventions may exist when assigning a particular reference designator. Such conventions can, for example, require use of particular alphanumeric characters or strings as a suffix, prefix, or other specific portion of a resultant reference designator identifier. The reference designator may be derived or dynamically calculated depending on the rules associated with the selected naming convention.

Other fields/attributes could of course be added to a part role definition, but to maintain a proper level of abstract logical application, part roles should ordinarily not include performance requirements, installation requirements, or location requirements that are particular to a given design or product. These important criteria are addressed in other ways pursuant to these embodiments. So defined, a part role can readily serve in a single source design construct with many of the attendant benefits of such an approach being realized.

Referring again to FIG. 2, for at least some applications, a part role may be an assembly of component part roles of various types. For example, an electrical equipment bay part role (assembly) may consist of a plurality of equipment rack part roles (components), each of which may consist of a plurality of shelf part roles, each of which may consist of a plurality of tray part roles.

A part role 21 may also have a "connects to" relationship to itself that is useful in defining a pathway network that represents all available routes between part role instances requiring interconnection. For example, linking wire harness part roles with connector assembly part roles using "connects to" relationships defines a network available for routing wiring required to connect electrical equipment such as switches and lights.

Figure 4:
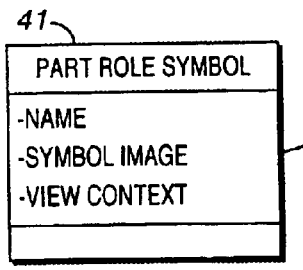
FIG. 4 comprises a general view of a part role as associated with a part role symbol as configured in accordance with an embodiment of the invention.
Figure 5:
FIG. 5 comprises a specific example of an illustrative part role symbol as configured in accordance with an embodiment of the invention.

For at least some applications, it may be helpful and useful to associate a graphic symbol or object with at least some of the defined part roles. Therefore, optionally, a symbol can be provided 12 to at least some selected part roles. As shown in FIG. 4, the part role symbol 41 will ordinarily have a name, a corresponding symbol image, and a view context. The name will typically comprise one or more words that serve to designate or suggest the corresponding part role type and context. The symbol will often comprise a set of graphic commands that will result in creation of a symbol within a given view (for example, and referring momentarily to FIG. 5, a symbol for a "Logo light control" part role might comprise a single pole switch symbol 51). The view context identifies the type or types of view for which the symbol can be used (for example, when the part role symbol includes a schematic representation of an electrical switch, such a symbol could be identified as being usable when the view comprises an electrical circuit schematic or wiring diagram). The part role symbol 41 can include one or more than one symbols as appropriate or desired, and each such symbol can be correlated with specific view contexts. In this embodiment, the part role symbol 41 is not an integral part of the part role 21, but rather is associated therewith. If desired, such symbols could be integrally combined within the part role definition itself, but this will often likely lead to a less efficient convention and unnecessarily complicate appropriate ease of use of the part roles themselves when facilitating the design and views of a given large-scale system, especially when different symbols for the same part role are needed on different views.

Figure 6:
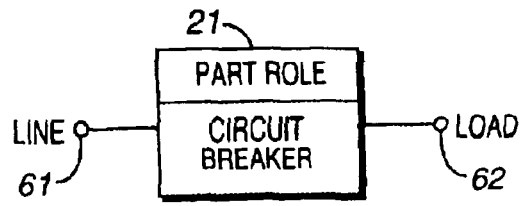
FIG. 6 comprises a schematic view of a specific illustrative example of electrical interfaces to a given part role as configured in accordance with an embodiment of the invention.
Figure 7:
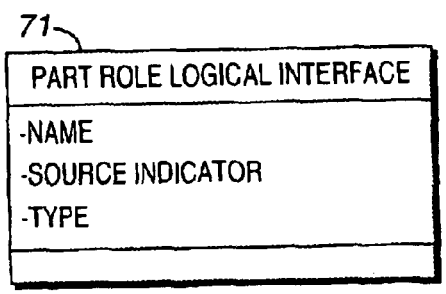
FIG. 7 comprises a general view of a part role logical interface as configured in accordance with an embodiment of the invention.
Figure 8:
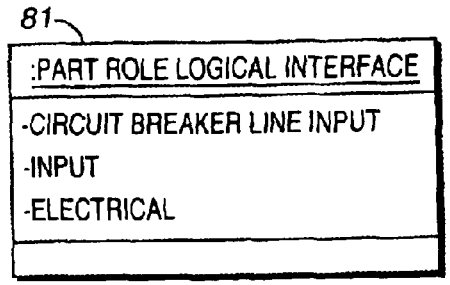
FIG. 8 comprises a specific example of an illustrative part role logical interface as configured in accordance with an embodiment of the invention.

Referring again to FIG. 1, the process next generally looks to define 13 part role logical interfaces. To generally illustrate this context, a part role 21 will typically have one or more necessary interfaces to other components, systems, or processes. For example, as illustrated in FIG. 6, a part role 21 for a circuit breaker would logically have both a line input 61 and a load output 62. The purpose of the part role logical interface is to abstractly represent such interfaces in a logical context (rather than physically or geometrically) and to essentially identify interfaces to at least one behavior of the corresponding part role (note: behaviors are not shown in the figures). Such interfaces can of course include electrical interfaces, hydraulic interfaces, mechanical linkages, and so forth. To serve these needs, and referring now to FIG. 7, a part role logical interface 71 will typically have a name, a source indicator, and a type. The name will usually comprise a word or words to designate the part role logical interface 71. Ordinarily, this name should reflect the function of the interface relative to the part role 21 itself. For example, and with momentary reference to FIG. 8, the name "Circuit breaker line input" may be appropriate for use with a circuit breaker part role logical interface. The source indicator serves to define whether the interface is an output or an input from the corresponding part role 21, or both. For example, as depicted in FIG. 8, a source indicator for a circuit breaker line input could be "Input" because the line input constitutes an input to the part role 21. Lastly, the type can serve to define the common characteristics of the part role logical interface (for example, to identify whether the interface is an electrical interface, a hydraulic interface, a pneumatic interface, a mechanical linkage interface, and so forth). In the example illustrated in FIG. 8, the type for a circuit breaker line input part role logical interface could be "Electrical." If desired, a subtype of this concept can be introduced and used, such as a physical part role logical interface that would, for example, define a physical interface such as specific mounting positions for a given part.

Figure 9:
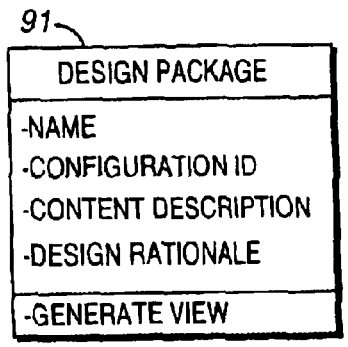
FIG. 9 comprises a general view of a design package as configured in accordance with an embodiment of the invention.

Referring again to FIG. 1, one or more design packages can be defined 14. A given design package defines a configuration through a collection of one or more configuration variables. With reference to FIG. 9, each design package 91 has a name, a configuration ID, a content description, and a design rationale. The name is a set of alphanumeric characters that designate the content of the design package 91. The configuration ID is an identifier that can aid in differentiating between design packages that represent distinct requirements. The content descriptor typically comprises text that describes the intent of the design package (for example, "Functional design of the stable requirements of a vehicle lighting system"). And the design rationale typically comprises text that describes any aspect of design rationale that a systems designer might wish to annotate and capture (for example, the design package 91 may relate to a change in the relative location of an active part role, and the design rationale could articulate the reason for effecting this change).

The design package 91 in a preferred embodiment also supports certain public operations. In particular, the design package 91 has a generate view operation. Simply put, the generate view capability serves to create a given type of view as may be requested by a user. For example, if the design package 91 related to a given electrical circuit, the generate view capability could generate a corresponding electrical schematic diagram using the user defined relationships among the part roles and the part role logical interfaces 71 contained in the design packages. The diagram would be displayed using the associated part role symbols 41.

Product data management systems as presently known and understood in the art provide a useful function in that a large number of objects, such as individual documents, can be effectively managed and tracked. Such systems typically serve to treat each such document or object as a managed entity and govern the creation, viewing, editing and modification, sharing, acceptance or authorization, and other states in the life of such objects. The design package 91 in this embodiment also inherits behaviors of such a managed entity. That is, a corresponding product data management system as understood in the art can be used with design packages to capture versions, revisions, state of the design package, applicability (conditions under which a design is valid for use), and effectivity (identification of the individual product for which the design is valid). Such a system can also be used to enforce change rules of choice and to otherwise link the design packages to work flow systems as desired.

Figure 10:
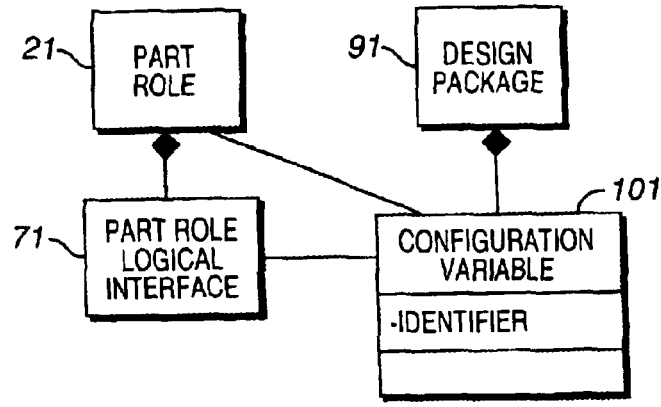
FIG. 10 comprises a general view of the linked associations between various of the above depicted components as configured in accordance with an embodiment of the invention.

Referring again to FIG. 1, configuration variables are also defined 15. Configuration variables serve to define the usage of part roles 21 pursuant to a given design package 91 through establishment of specific linking relationships. With reference to FIG. 10, a configuration variable 101 generally includes an identifier comprising a string of alphanumeric characters that designate a particular instance. The configuration variables themselves can be of varying type. For example, there can usefully be:

Connection: A type of configuration variable that captures the requirement for a connective path between two part role logical interfaces (including functional interconnects and electrical connections).

Part role installation requirement: A type of configuration variable that captures the physical installation requirements of a part role from the perspective of a systems designer (a specific part role may have multiple part role installation requirements with each being associated with a different and specific part role usage—for example some switches must be within reach of the pilot).

Part role installation design: A type of configuration variable that captures design decisions made by an installations designer to install (assign) a part role at a part role physical interface (i.e., a mounting position). A part role can have multiple position assignments depending upon variations in the functional requirements of the large scale system as may be required, for example, by different customers.

Part role usage: A type of configuration variable that represents the usage of a part role in a design package (by collecting relative location requirements, part requirements, and part role installation requirements as associated with specific uses). For example, part role usage can specify or define at least some performance requirements, installation requirements, and/or location requirements for a corresponding design package.

Routed connection segment: A type of configuration variable that represents a route through a specific physical or electrical path (such as, for example, a path through a manifold type of part role).

Logical to physical map: A type of configuration variable that represents the mapping of a physical interface on a selected part to a logical interface on a part role.

Part selection: A type of configuration variable that identifies the part as selected by a designer to realize a part role in the context of a specific product (a given part role, of course, can have multiple part selection configuration variables wherein each is associated with a different part role usage configuration variable).

Active equipment part role usage: A type of configuration variable that collects requirements through links to various part roles and other requirements within the context of a specific design configuration.

So defined and provided, the configuration variables 101 serve to associate design packages 91 with part roles 21 and/or part role logical interfaces 71. Depending upon the type of configuration variables 101 employed, various logical and/or physical designs can be realized notwithstanding a core set of relatively abstract part roles and part role logical interfaces, thereby preserving an effective single source of product definition working construct for structuring such knowledge.

Figure 11:
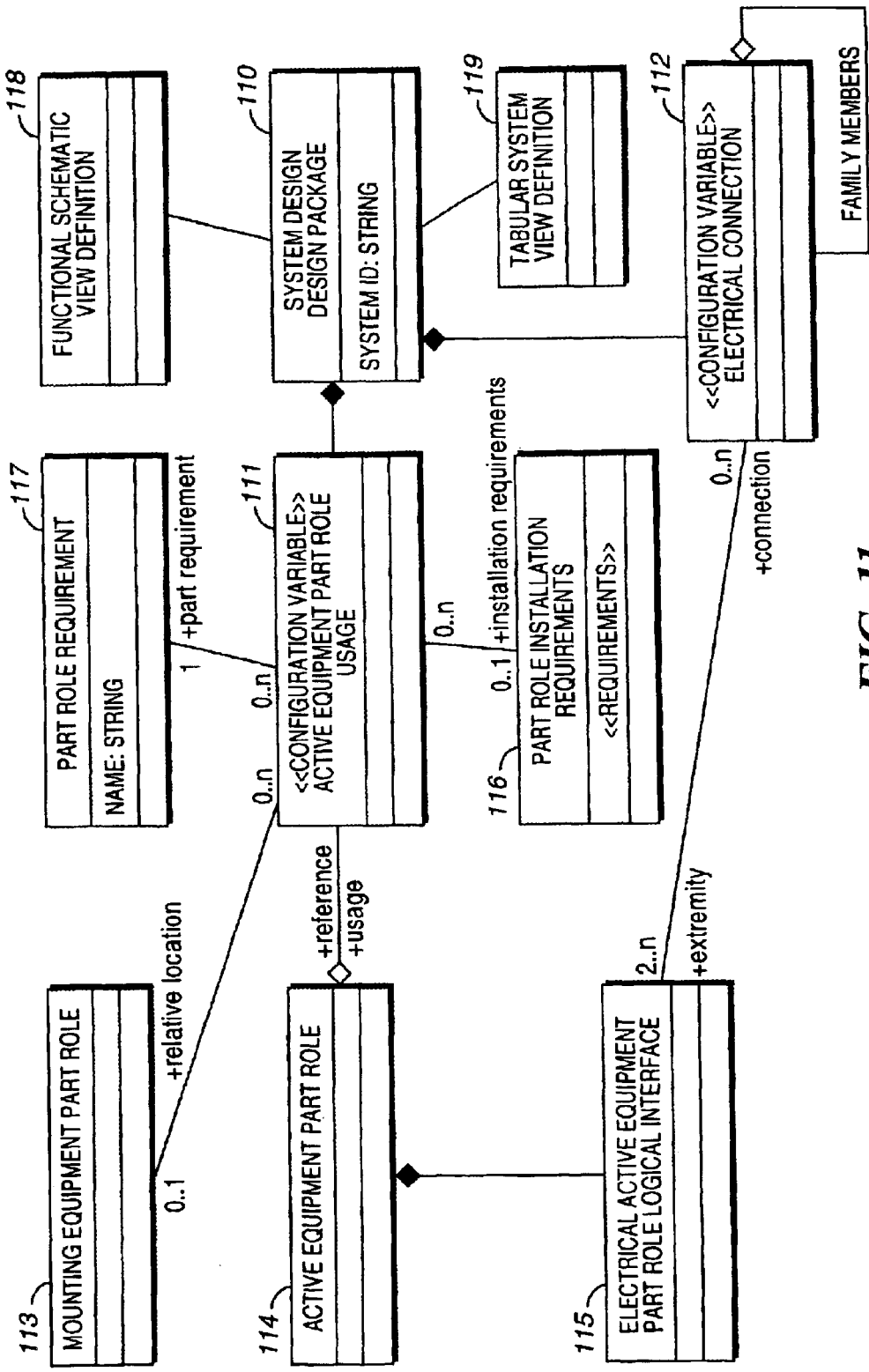
FIG. 11 comprises a more specific view of various linked associations as correspond to an exemplary electrical system design as configured in accordance with an embodiment of the invention.

Referring to FIG. 11, an example (presented in conformance with a more complete usage of Unified Modeling Language syntax and structure) of the application of abstract part role and design package pattern is provided for a potential electrical systems design. The systems design design package 110 (a type of design package) contains an active equipment part role usage configuration variable 111 and electrical connection configuration variable 112 (a type of connection configuration variable). The active equipment part role usage configuration variable 111 collects requirements through links to a part role requirement 117, a part role installation requirement 116, and a mounting equipment part role 113 for the usage of an active equipment part role 114, all within the context of a specific design configuration as set by the systems design design package 110. The electrical connection configuration variable 112 enables capturing the interconnection requirements of instances of the active equipment part role 114 through instances of electrical active equipment part role logical interface 115. This systems design design package 110 can be viewed in formats defined by a corresponding functional schematic view definition 118 and a tabular system view definition 119.

The systems design design package 110 is a requirement that is used by subsequent design processes that, in turn, create design packages that capture design decisions as solutions to this requirement. The selections of an electrical part and its logical mounting position, that meet the requirements associated with an active equipment part role usage 123, are examples of solutions.

Figure 12:
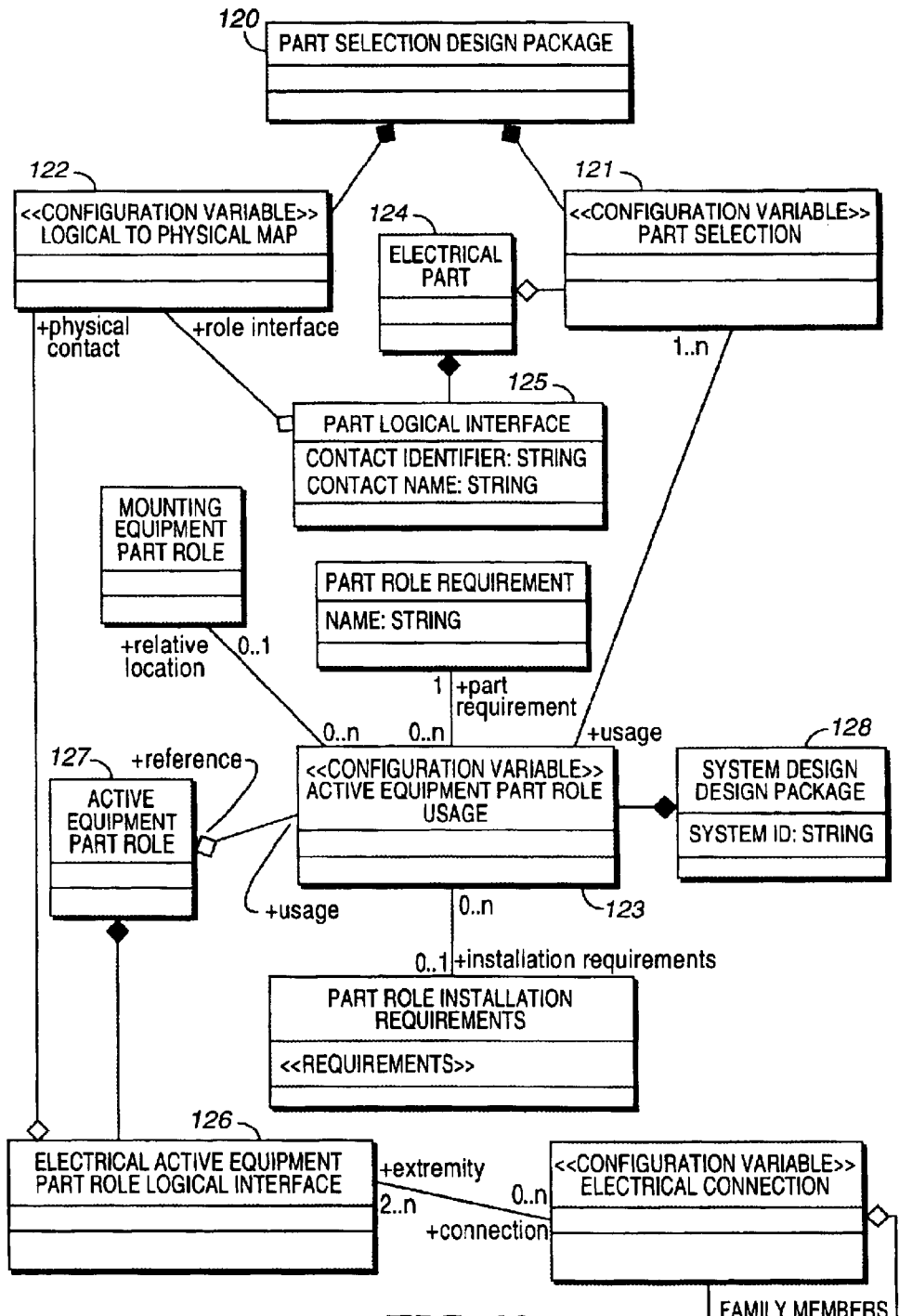
FIG. 12 comprises a more specific view of various linked associations as correspond to an example of part selection as configured in accordance with an embodiment of the invention.

Referring to FIG. 12, an extension of the electrical systems design example as presented in FIG. 11 is offered here for part selection. The part selection design package 120 comprises a type of design package that contains a part selection configuration variable 121 and a logical to physical map configuration variable 122. The part selection configuration variable 121 links the active equipment part role usage configuration variable 123 to an electrical part 124. The logical to physical map configuration variable 122 in turn links a part logical interface 125 to an electrical active equipment part role logical interface 126. So configured, the selection of an instance of electrical part 124 constitutes a solution to the requirements associated with an instance of the usage of an active equipment part role 127 for a given system design design package 128.

Figure 13:
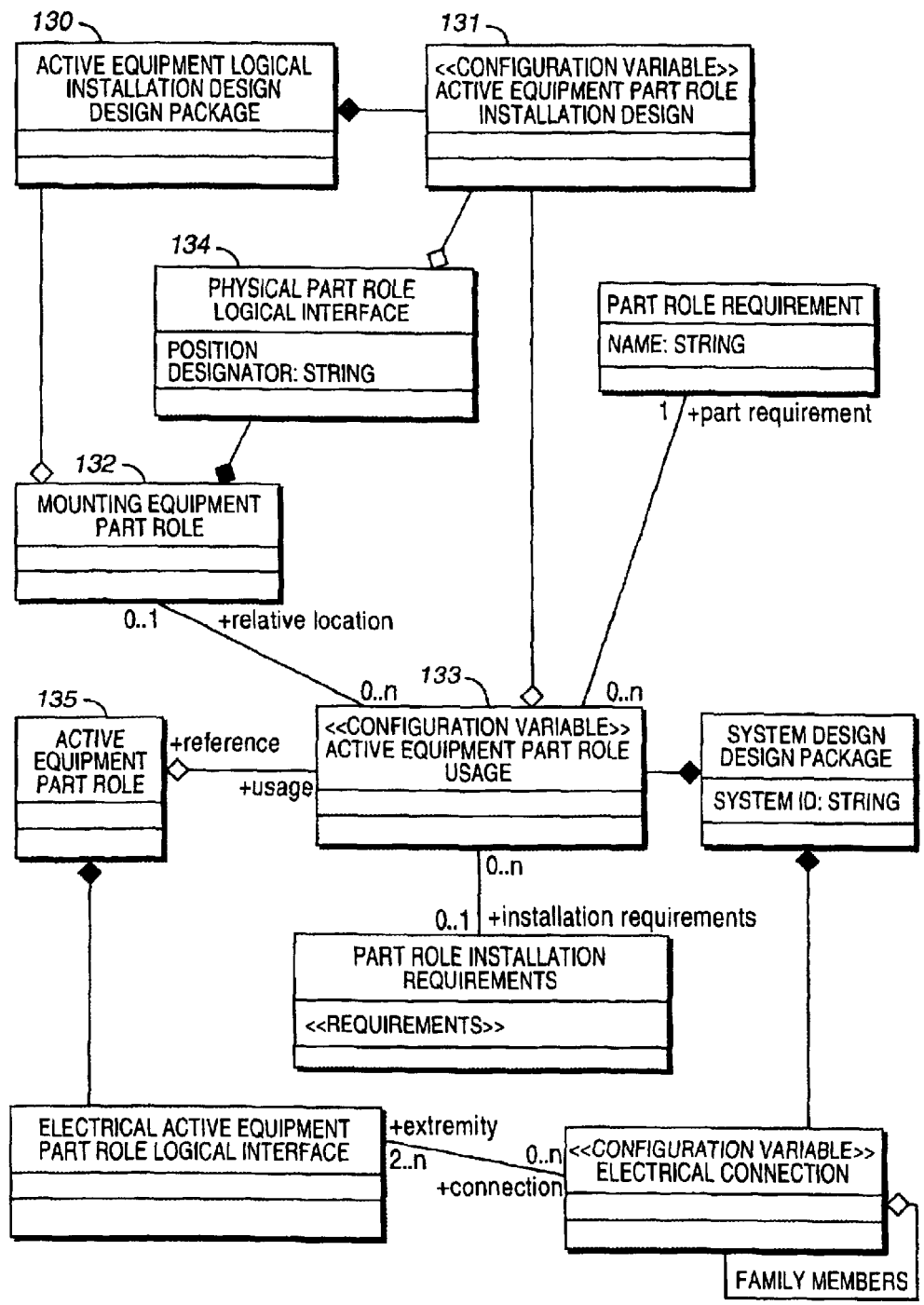
FIG. 13 comprises a more specific view of the linked associations depicted in FIG. 10 for two types of design package, two types of part role, one type of part role logical interface, a part logical interface, a part, and four types of configuration variable as configured in accordance with an embodiment of the invention.

Referring now to FIG. 13, an extension of the electrical systems design example as set forth in FIG. 11 is provided for an active equipment logical installation design design package 130 that captures the installation design decisions identifying the allocation of specific mounting positions (physical part role logical interface 134) on a mounting equipment part role 132 to active equipment part role usages 133. Specifically, the active equipment logical installation design design package 130 comprises in this example a design package that contains an active equipment part role installation design configuration variable 131 and is also linked to a mounting equipment part role 132 (for which it specifies a partial configuration). The active equipment part role installation design configuration variable 131 links the usage 133 of an active equipment part role to a physical part role logical interface 134 of the mounting equipment part role 132. Physical part role logical interface instances such as this correspond to position identifiers on mounting equipment. For example, a panel that mounts circuit breakers may have positions denoted as A1, A2, A3, B1, B2, and B3. The active equipment logical installation design design package 130 can capture the design decision of an installation designer to mount an active equipment part role 135 at a specific logical position such as A1 on a specific mounting equipment part role (such as, for example, a panel denoted as "P5"). Such use of relative location decouples this decision from the specific coordinates of position A1. As a result, changes in the physical design of the panel do not affect the logical installations design and again it is seen that a single source of product definition is preserved.

With reference again to FIG. 1, a completed design is viewable 16 by a user as desired. These views can of course correspond to the form of typical design artifacts as are produced by current practice. Pursuant to these embodiments, however, such views are generated from a single source knowledge structure and will consequently and necessarily be 100% consistent with all other views of the product design. While FIG. 1 implies a serial flow, the actual flow is iterative, with parallel elements between iterations.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

What is claimed is:

1. A method for structuring knowledge to thereby facilitate designing large-scale systems wherein the design is comprised of a large plurality of distinct product views which distinct product views are comprised of a plurality of design elements that define at least some aspect of a function of at least one of a part and an assembly of parts, comprising:
  defining a plurality of part roles that each define a function of a part wherein at least some of the part roles each represent a plurality of common design elements as shared by a family of product artifacts and wherein each part role includes:
    a part role name that is at least partially a first generic description of corresponding design elements that are common with a family of the product artifacts;
    a role description comprising a short textual definition that corresponds to the part role;
    a type indicator that is a second generic description of the corresponding design elements, which second generic description is more generic than the first generic description; and
    a reference designator comprising an alphanumeric string unique to the corresponding part role;
  such that a resultant single source of product definition is substantially achieved.

2. The method of claim 1 and further comprising providing at least one graphic symbol for each of at least some of the plurality of part roles.

3. The method of claim 1 and further comprising defining a plurality of part role logical interfaces that identify interfaces to part role behavior.

4. The method of claim 3 wherein defining a plurality of part role logical interfaces includes defining a plurality of part role logical interfaces that identify at least one of an electrical interface, hydraulic interface, pneumatic interface, mechanical interface, and a physical interface.

5. The method of claim 4 and further comprising defining a linking relationship between at least some of the part roles and some of the part role logical interfaces.

6. The method of claim 1 and further comprising defining an assembly relationship between at least two part roles.

7. The method of claim 1 and further comprising defining at least one design package comprising:
  a design package name that is at least partially a first generic description of a configuration of the design elements; and
  a configuration identifier comprising an alphanumeric string unique to the at least one design package.

8. The method of claim 7 wherein defining at least one design package includes designing a plurality of the design packages.

9. The method of claim 7 and further comprising storing the at least one design package and the plurality of part roles.

10. The method of claim 7 and further comprising defining a plurality of configuration variables that define a usage of the part roles in the design package.

11. The method of claim 10 and further comprising storing at least some of the plurality of configuration variables.

12. The method of claim 11 and further comprising defining a plurality of part role usages that define at least some performance requirements, installation requirements, and location requirements for a corresponding design package.

13. The method of claim 7 and further comprising providing at least one view definition that corresponds to the at least one design package.

14. The method of claim 10 wherein at least some of the part role usages do not include performance requirements.

15. The method of claim 10 wherein at least some of the part role usages do not include installation requirements.

16. The method of claim 10 wherein at least some of the part role usages do not include location requirements.

17. The method of claim 1 and further comprising using the plurality of part roles when designing a large-scale system, such that at least some of the plurality of part roles each correspond to a plurality of differing product artifacts.

18. The method of claim 17 wherein using the plurality of part roles when designing a large-scale system, such that at least some of the plurality of part roles each correspond to a plurality of differing product artifacts includes using the plurality of part roles when designing a large-scale system, such that at least some of the plurality of part roles each correspond to a plurality of product artifacts that differ from one another at least with respect to performance requirements.

19. The method of claim 17 wherein using the plurality of part roles when designing a large-scale system, such that at least some of the plurality of part roles each correspond to a plurality of differing product artifacts includes using the plurality of part roles when designing a large-scale system, such that at least some of the plurality of part roles each correspond to a plurality of product artifacts that differ from one another at least with respect to installation requirements.

20. The method of claim 17 wherein using the plurality of part roles when designing a large-scale system, such that at least some of the plurality of part roles each correspond to a plurality of differing product artifacts includes using the plurality of part roles when designing a large-scale system, such that at least some of the plurality of part roles each correspond to a plurality of product artifacts that differ from one another at least with respect to location requirements.

21. The method of claim 1 and further comprising defining a design package as a solution to requirements that are at least partially defined by at least one other design package.

22. The method of claim 1 and further comprising defining a connects to relationship between at least two part roles.

* * * * *